United States Patent
Farnham et al.

(10) Patent No.: US 9,169,383 B2
(45) Date of Patent: Oct. 27, 2015

(54) PREPARATION, PURIFICATION AND USE OF HIGH-X DIBLOCK COPOLYMERS

(71) Applicant: E I DU PONT DE NEMOURS AND COMPANY, Wilmington, DE (US)

(72) Inventors: William Brown Farnham, Hockessin, DE (US); Michael Thomas Sheehan, Corpus Christi, TX (US); Hoang Vi Tran, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/377,342

(22) PCT Filed: Feb. 11, 2013

(86) PCT No.: PCT/US2013/025514
§ 371 (c)(1),
(2) Date: Aug. 7, 2014

(87) PCT Pub. No.: WO2013/120055
PCT Pub. Date: Aug. 15, 2013

(65) Prior Publication Data
US 2015/0011700 A1    Jan. 8, 2015

Related U.S. Application Data

(60) Provisional application No. 61/597,583, filed on Feb. 10, 2012.

(51) Int. Cl.
*C08L 53/00* (2006.01)
*C08L 33/06* (2006.01)
*C08F 6/12* (2006.01)
*C08F 6/14* (2006.01)
*C08F 293/00* (2006.01)

(52) U.S. Cl.
CPC . *C08L 53/00* (2013.01); *C08F 6/12* (2013.01); *C08F 6/14* (2013.01); *C08F 293/005* (2013.01)

(58) Field of Classification Search
CPC ....................................................... C08L 53/00
USPC ....................................................... 524/505
See application file for complete search history.

(56) References Cited

U.S. PATENT DOCUMENTS

| | | | |
|---|---|---|---|
| 2007/0054985 A1* | 3/2007 | Joanicot et al. | 523/332 |
| 2008/0093743 A1 | 4/2008 | Yang et al. | |
| 2008/0299353 A1 | 12/2008 | Stoykovich et al. | |
| 2010/0294740 A1 | 11/2010 | Cheng et al. | |

FOREIGN PATENT DOCUMENTS

| | | |
|---|---|---|
| WO | 2010/096363 A2 | 8/2010 |
| WO | 2011/110841 A2 | 9/2011 |
| WO | 2011/151109 A1 | 12/2011 |

OTHER PUBLICATIONS

Zhou et al., Journal of Polymer Science Part A: POlymer Chemistry, vol. 49, 3647-3657, 2011.*
K.W. Guarini et al, "Optimization of Diblock Copolymer Thin Film Self Assembly", Advanced Materials, 2002, V. 14, No. 18, pp. 1290-1294.
Cheng et al, "Templated Self-Assembly of Block Copolymers: Top-Down Helps Bottom-Up", Advanced Materials, 2006, vol. 18, #19, pp. 2505-2521.
S.O. Kim et al, "Epitaxial Self-Assembly of Block Copolymers on Lithographically Defined Nanopatterned Substrates", Nature, Jul. 2003, vol. 424, pp. 411-414.
International Search Report dated Apr. 26, 2013, PCT/US2013/025514.
Arnold et al, "Gas Permeation Properties of Poly(1,1'-dihydroperfluorooctyl acrylate), Poly(1,1'-dihydroperfluorooctyl methacrylate), and Poly(styrene)-b-poly(1,1'-dihydroperfluorooctyl acrylate) Block Copolymers", Macromoleules, 2001, 34, pp. 5611-5619.
Lacroix-Desmazes et al, "Macromolecular Surfactants for Supercritical Carbon Dioxide Applications: Synthesis and Characterization of Fluorinated Block Copolymers Prepared by Nitroxide-Mediated Radical Polymerization", J. of Polymer Science: Part A: Polymer Chemistry, vol. 42, pp. 3537-3552 (2004).
Zhou et al, "Fluorinated AB Diblock Copolymers and Their Aggregates in Organic Solvents", J. of Polymer Science: Part A: Polymer Chemistry, vol. 49, pp. 3647-3657 (2011).

* cited by examiner

*Primary Examiner* — Hui Chin

(57) ABSTRACT

This invention relates to the preparation and purification of high-X ("chi") diblock copolymers. Such copolymers contain two segments ("blocks") of polymers with significantly different interaction parameters and can be used in directed self-assembly applications.

7 Claims, No Drawings

PREPARATION, PURIFICATION AND USE OF HIGH-X DIBLOCK COPOLYMERS

FIELD OF THE INVENTION

This invention relates to the preparation and purification of high-X ("chi") diblock copolymers. Such copolymers contain two segments ("blocks") of polymers with significantly different interaction parameters and can be used in directed self-assembly applications.

BACKGROUND

Directed self-assembly (DSA) is a technique in which diblock copolymers (BCP) containing dissimilar and non-intermixing blocks self-segregate into domains of homogeneous blocks. These domains may yield random patterns or, when directed, give well-defined and highly regular structures dictated by the molecular weight of each block. The ability of DSA to provide very small (sub-20-nm features) has quickly moved this technology into consideration as a viable option for integrated circuit production and semiconductor manufacturing processes.

DSA is also being investigated as a method for preparing nano-structured surfaces with unique surface physical properties. Possible applications include changing the hydrophobicity of surfaces due to incorporation of nano-structures and providing sites for unique chemical catalysts. DSA has promising applications in biomedical areas, including: drug delivery; protein purification, detection, and delivery; gene transfection; antibacterial or antifouling materials; and cytomimetic chemistry.

The ability to self-assemble is dependent on the Flory-Huggins Interaction Parameter (x). Higher values of x allow for lower molecular weight polymers to assemble, leading to smaller block domains and hence feature sizes, since the natural feature pitch ($L_o$) of lamellae-forming diblock copolymers is proportional to the degree of polymerization. It also allows for greater thermodynamic driving force to direct assembly onto either physically or chemically differentiated surfaces. To meet the needs of applications such as magnetic storage and semiconductor devices, many recent efforts have been aimed at achieving long-range ordering, good feature registration, and accurate pattern placement with very few defects. For example, a thin film of polystyrene/poly(methyl methacrylate) diblock copolymers can be spin-cast from a dilute toluene solution, then annealed, to form a hexagonal array of poly(methylmethacrylate) cylinders in a matrix of polystyrene (K. W. Guarini et al., Adv. Mater. 2002, 14, No. 18, 1290-4). Patterns of parallel lines have also been produced using PS-b-PMMA on chemically nanopatterned substrates (S. O. Kim et al., Nature, 2003, 424, 411-4).

Although there have been reports of using blends of diblock copolymers with the corresponding homopolymer(s) in forming patterns via directed self-assembly (e.g., US 2008/0299353), it is believed that there could be advantages in using block copolymers that are substantially free of homopolymer contaminants so that the composition of such blends can be more precisely controlled. However, it can be quite difficult to achieve the desired level of purity of the diblock copolymer without resorting to complex time- and resource-intensive procedures or sacrificing yield. Examples of attempts to achieve this desired end result are disclosed in U.S. Pat. No. 7,521,094; US 2008/0093743; US 2008/0299353; US 2010/0294740; and WO 2011/151109. However, none of these procedures produced a product suitable for DSA applications.

Therefore, there remains a need for scalable processes for separating homopolymer contaminants from the corresponding diblock copolymer.

SUMMARY

One aspect of this invention is a first composition comprising a block copolymer, wherein the block copolymer comprises:
a) a first block derived from the polymerization of Monomer1,

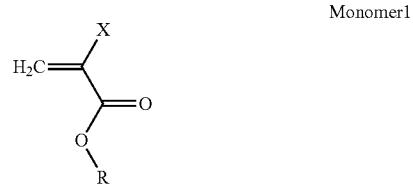

Monomer1 wherein X is H or methyl, R is selected from the group consisting of: $C_1$-$C_8$ alkyl and partially fluorinated alkyl groups, optionally substituted with hydroxyl or protected hydroxyl groups and optionally containing ether linkages; and $C_3$-$C_8$ cycloalkyl groups; and
b) a second block covalently attached to the first block, wherein the second block is derived from the polymerization of Monomer2,

Monomer2 wherein Ar is a pyridyl group, a phenyl group, or a phenyl group comprising substituents selected from the group consisting of hydroxyl, protected hydroxyl, acetoxy, $C_1$-$C_4$ alkoxy groups, phenyl, substituted phenyl, —$SiR'_{13}$, and —OC(O)OR', where R' is selected from the group consisting of $C_1$-$C_8$ alkyl groups; and wherein:
  Monomer1 and Monomer2 are selected such that the difference between the surface energy values of a homopolymer of Monomer1 and a homopolymer of Monomer2 is greater than 10 dynes/cm;
  the first block comprises 5-95 wt % of the block copolymer;
  the molecular weight of the block copolymer is between 5,000 and 250,000; and
  the first composition comprises less than 5 wt % of the homopolymer of Monomer1 and less than 5 wt % of the homopolymer of Monomer2, as determined by interaction polymer chromatography (IPC).

Another aspect of this invention is a process comprising:
a) forming in a first solvent a polymer mixture comprising a diblock copolymer, poly(Monomer1)-b-poly(Monomer2), and at least one homopolymer selected from poly(Monomer1) and poly(Monomer2);
b) adding a second solvent to the polymer mixture to form:
  micelles comprising the diblock copolymer and
  a solution comprising at least one of poly(Monomer1) and poly(Monomer2);
c) inducing micellar aggregation to form isolable particles; and
d) separating the particles from the solution, wherein the solution comprises at least one of poly(Monomer1) and poly(Monomer2).

Another aspect of this invention is an article comprising a substrate and the first composition disposed on the substrate.

Another aspect of this invention is a composition comprising a block copolymer, wherein the block copolymer comprises:
a) a first block derived from the polymerization of a monomer selected from the group consisting of isobornyl(meth)acrylate, trifluoroethyl(meth)acrylate, hexafluoroisopropyl (meth)acrylate, octafluoropentyl(meth)acrylate, $CH_2\!=\!C(CH_3)CO_2CH_2C(CF_3)_2OH$ and its protected analogues, $CH_2\!=\!C(CH_3)CO_2CH_2CH_2CH_2CF_2C_4F_9$, $CH_2\!=\!C(CH_3)CO_2CH_2CH_2C_6F_{13}$, $CH_2\!=\!C(CH_3)CO_2CH_2CH_2C_4F_9$, $CH_2\!=\!C(CH_3)CO_2CH_2CH_2C_3F_7$, $CH_2\!=\!C(CH_3)CO_2C(CH_3)_2CH_2CH_2C_6F_{13}$, $CH_2\!=\!C(CH_3)CO_2CH_2C_2F_5$, $CH_2\!=\!C(CH_3)CO_2C_2H_4C_2F_5$, and $CH_2\!=\!C(CH_3)CO_2CH_2C_3F_7$;
and
b) a second block covalently attached to the first block, wherein the second block is derived from the polymerization of Monomer2,

Monomer2 wherein Ar is a pyridyl group, a phenyl group, or a phenyl group comprising substituents selected from the group consisting of hydroxyl, protected hydroxyl, acetoxy, $C_1$-$C_4$ alkoxy groups, phenyl, substituted phenyl, —$SiR'_3$, and —$OC(O)OR'$, where R' is selected from the group consisting of $C_1$-$C_8$ alkyl groups.

Another aspect of this invention is a method comprising:
a) creating a modified surface on a substrate by applying a surface agent to the substrate, the modified surface characterized by a first surface energy;
b) applying energy to the modified surface to form an imaged-modified surface having at least an imaged portion and a non-imaged portion, with the imaged portion having a second surface energy;
c) contacting the imaged-modified surface with a block copolymer composition to form a selected pattern based upon at least one of the first surface energy and the second surface energy,
wherein the block copolymer comprises:
  i) a first block derived from the polymerization of Monomer1,

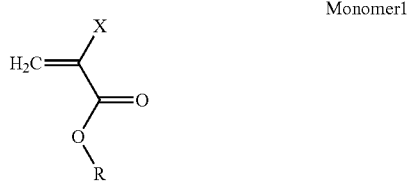

Monomer1 wherein X is H or methyl, R is selected from the group consisting of: $C_1$-$C_8$ alkyl and partially fluorinated alkyl groups, optionally substituted with hydroxyl or protected hydroxyl groups and optionally containing ether linkages; and $C_3$-$C_8$ cycloalkyl groups; and
  ii) a second block covalently attached to the first block, wherein the second block is derived from the polymerization of Monomer2,

Monomer2 wherein Ar is a pyridyl group, a phenyl group, or a phenyl group comprising substituents selected from the group consisting of hydroxyl, protected hydroxyl, acetoxy, $C_1$-$C_4$ alkoxy groups, phenyl, substituted phenyl, —$SiR'_3$, and —$OC(O)OR'$, where R' is selected from the group consisting of $C_1$-$C_8$ alkyl groups,
and wherein:
  Monomer1 and Monomer2 are selected such that the difference between the surface energy values of a homopolymer of Monomer1 and a homopolymer of Monomer2 is greater than 10 dynes/cm;
  the first block comprises 5-95 wt % of the block copolymer,
  the molecular weight of the block copolymer is between 5,000 and 250,000, and
  the composition comprises less than 5 wt % of the homopolymer of Monomer1 and less than 5 wt % of the homopolymer of Monomer2, as determined by interaction polymer chromatography (IPC).

DETAILED DESCRIPTION

Herein, the term "block copolymer" refers to a copolymer comprising blocks (i.e., segments) of different polymerized monomers. For example, PMMA-b-PS is "diblock" copolymer comprising blocks of poly(methyl methacrylate) and polystyrene, which can be prepared using RAFT processes by first polymerizing methyl methacrylate and then polymerizing styrene from the reactive end of the poly(methyl methacrylate) chains. Alternatively, PS-b-PMMA diblock copolymers can be made by anionic polymerization processes. Diblock copolymers can be made by well-known techniques such as atom transfer free radical polymerization (ATRP), reversible addition fragmentation chain transfer (RAFT), ring-opening metathesis polymerization (ROMP), and living cationic or living anionic polymerizations.

"Diblock copolymers" can also be described by the monomer constituents alone, e.g., MMA-b-S is equivalent to PMMA-b-PS. For many purposes, the order of the monomers is largely immaterial to the function or use of the diblock copolymer, so that a PMMA-b-PS will behave very similarly to PS-b-PMMA, even though the diblock copolymers may have been made by different routes.

Suitable monomers corresponding to Monomer1 include methyl(meth)acrylate, ethyl(meth)acrylate, propyl(meth)acrylate (all isomers), butyl(meth)acrylate (all isomers), pentyl(meth)acrylate (all isomers), hexyl(meth)acrylate (all isomers), cyclohexyl(meth)acrylate, isobornyl(meth)acrylate, and partially fluorinated derivatives thereof, e.g., trifluoroethyl(meth)acrylate, pentafluoropropyl (meth)acrylate, hexafluoroisopropyl (meth)acrylate, and octafluoropentyl (meth)acrylate. Suitable monomers corresponding to Monomer1 also include hydroxy-substituted monomers such as FOHMAC ($CH_2\!=\!C(CH_3)CO_2CH_2C(CF_3)_2OH$) and their protected analogues, and partially fluorinated monomers such as C4VDF-MA ($CH_2\!=\!C(CH_3)CO_2CH_2CH_2CH_2CF_2C_4F_9$), and C6-ZFM ($CH_2\!=\!C(CH_3)CO_2CH_2CH_2C_6F_{13}$), C4-ZFM ($CH_2\!=\!C(CH_3)CO_2CH_2CH_2C_4F_9$), C3-ZFM ($CH_2\!=\!C(CH_3)CO_2CH_2CH_2C_3F_7$), $CH_2\!=\!C(CH_3)CO_2CH_2C_2F_5$, $CH_2\!=\!C(CH_3)CO_2C_2H_4C_2F_5$, $CH_2\!=\!C(CH_3)CO_2$ C(CH$_3$)$_2$CH$_2$CH$_2$C$_6$F$_{13}$, CH$_2$=C(CH$_3$)CO$_2$CH$_2$CF$_2$CF$_2$CF$_2$CF$_2$H, and (CH$_2$=C(CH$_3$)CO$_2$CH$_2$C$_3$F$_7$). In some embodiments, a fluorocarbon (meth)acrylate block is employed for its ability to be photolytically removed while the other block remains for further post-processing.

Suitable monomers corresponding to Monomer2 include styrene, acetoxystyrene, methoxystyrene, ethoxystyrene, propoxystyrene, butoxystyrene, vinylpyridine, and styrenes substituted on the aromatic ring with phenyl groups, substituted phenyl groups, —SiR'$_3$ groups, or —OC(O)OR' groups, where R' is selected from the group consisting of C$_1$-C$_8$ alkyl groups.

One aspect of this invention is a composition comprising a block copolymer, wherein the block copolymer comprises:
a) a first block derived from the polymerization of a monomer selected from the group consisting of isobornyl (meth)acrylate, trifluoroethyl (meth)acrylate, hexafluoroisopropyl (meth)acrylate, octafluoropentyl (meth)acrylate, (CH$_2$=C(CH$_3$)CO$_2$CH$_2$C(CF$_3$)$_2$OH) and its protected analogues, (CH$_2$=C(CH$_3$)CO$_2$CH$_2$CH$_2$CH$_2$CF$_2$C$_4$F$_9$), (CH$_2$=C(CH$_3$)CO$_2$CH$_2$CH$_2$C$_6$F$_{13}$), (CH$_2$=C(CH$_3$)CO$_2$CH$_2$CH$_2$C$_4$F$_9$), (CH$_2$=C(CH$_3$)CO$_2$CH$_2$CH$_2$C$_3$F$_7$), CH$_2$=C(CH$_3$)CO$_2$C(CH$_3$)$_2$CH$_2$CH$_2$C$_6$F$_{13}$, CH$_2$=C(CH$_3$)CO$_2$CH$_2$C$_2$F$_5$, CH$_2$=C(CH$_3$)CO$_2$C$_2$H$_4$C$_2$F$_5$, and (CH$_2$=C(CH$_3$)CO$_2$CH$_2$C$_3$F$_7$); and
b) a second block covalently attached to the first block, wherein the second block is derived from the polymerization of Monomer2,

Monomer2 wherein Ar is a pyridyl group, a phenyl group, or a phenyl group comprising substituents selected from the group consisting of hydroxyl, protected hydroxyl, acetoxy, C$_1$-C$_4$ alkoxy groups, phenyl, substituted phenyl, —SiR'$_3$, and —OC(O)OR', where R' is selected from the group consisting of C$_1$-C$_8$ alkyl groups.

In some embodiments, the first block comprises two or more monomers of the type Monomer1. In some embodiments, the second block comprises two or more monomers of the type Monomer2.

In some embodiments, Monomer2 is t-butoxystyrene or t-butoxycarbonyloxystyrene.

In its simplest form, the Flory-Huggins Interaction Parameter, X ("chi"), can be taken to be a measure of miscibility of a polymer and a small molecule or another polymer in a binary mixture. Diblock copolymers are said to be "high X" when the two blocks are highly immiscible. The total surface energy, which is the sum of the polar surface energy and the dispersive surface energy, of the two blocks is related to the X of the copolymer and is easier to determine than X itself. The total surface energy can be determined by measuring the contact angles for water and decalin on a polymer surface and calculating the polar and dispersive surface energies for that surface by the method of Fowkes. One can use published or experimentally-determined values of the total surface energies of homopolymers of interest to select pairs of polymers with large differences in surface energies (e.g., at least 10 dynes/cm). Diblock copolymers comprising blocks of such polymer pairs will be "high X" diblock copolymers.

The surface energies of selected homopolymers are given in Table 1.

TABLE 1

Total Surface Energy of Various Homopolymers

| Polymer | Total Surface Energy (dynes/cm) |
|---|---|
| Poly(hydroxystyrene) | 45.0 |
| Poly(4-vinylpyridine) | 44.8 |
| Poly(hydroxyethylmethacrylate) | 41.2 |
| Poly(methylmethacrylate) | 38.4 |
| Poly(acetoxystyrene) | 38.3 |
| Poly(2-vinylpyridine) | 37.7 |
| Poly(methoxystyrene) | 36.6 |
| Poly(isobutylmethacrylate) | 35.7 |
| Poly(cyclohexylmethacrylate) | 34.1 |
| Poly(t-butoxystyrene) | 33.0 |
| Poly(isobornylmethacrylate) | 32.6 |
| Poly(styrene) | 31.7 |
| Poly(t-butylmethacrylate) | 29.7 |
| Poly(FOHMAC) | 25.8 |
| Poly(pentafluorostyrene) | 25.4 |
| Poly(C6-ZFM) | 13.1 |

The first block of the diblock copolymer can be prepared, for example, by RAFT polymerization methods, which provide polymers with narrow polydispersities. Typically, the methacrylate block is prepared first by polymerizing Monomer1 using RAFT methods, and then the other block is built up by polymerizing Monomer2 onto the living end of the methacrylate block.

In a typical RAFT polymerization, an initiator is added under an inert atmosphere to a heated solution of Monomer1, a solvent, and a trithiocarbonate RAFT agent, e.g., (C$_{12}$H$_{25}$SC(S)SC(CH$_3$)(CN)CH$_2$CH$_2$CO$_2$CH$_3$). When the reaction is complete, the product (which will form the first block of the diblock copolymer) is isolated by precipitation in a non-solvent. In some embodiments, the polydispersity of this product is less than 1.25, 1.20, 1.15, 1.10 or 1.05.

The second block of the diblock copolymer is typically formed from a styrene or vinylpyridine. This block can be prepared by adding a solution of Monomer2 to a solution of the precipitated product of the RAFT polymerization and heating. Progress of the reaction can be followed by standard analytical techniques, e.g., $^1$H NMR. Initial isolation of the crude diblock product can be achieved by precipitation in a non-solvent.

Suitable non-solvents include alcohols (e.g., methanol or ethanol) and alkanes (e.g., hexane or heptane).

The lengths of the first and second blocks are determined by the degree of polymerization of each segment, and can be individually controlled. Typically, the ratio of the degree of polymerization for the two blocks is between 1:4 and 4:1.

In some embodiments, the Monomer1 comprises a protected functional group which is removed after either the formation of the first block or after the formation of the diblock copolymer. In some embodiments, Monomer2 comprises a protected functional group which is deprotected after formation of the diblock copolymer.

The initially isolated crude diblock copolymer typically comprises the desired diblock copolymer, as well as some of the homopolymer of Monomer1 and the homopolymer of Monomer2. For some of the more demanding applications involving diblock copolymers, it is desirable to remove the homopolymers, as well as diblock copolymers which are outside the targeted range of ratio of the diblock composition.

Because the diblock copolymer typically contains segments of differing polarities and solubilities, common methods of purifying the crude diblock copolymer product, such as extraction with a succession of solvents, have been found to be largely unsatisfactory, giving either poor separation or difficult-to-process solids.

It has now been found that the diblock copolymers formed from Monomer1 and Monomer2 can be purified by use of solvents or solvent mixtures that induce the formation of micelles (as indicated by light-scattering) which can be induced to agglomerate, forming solids processable by filtration or centrifugation. One of the homopolymers remains in solution and can be removed, e.g., by filtration or decantation. The second homopolymer can be removed by extraction, selective precipitation, or micellar agglomeration. In some embodiments, e.g., those in which the first block is formed by RAFT polymerization, it may be useful to remove the sulfur-containing end-groups either before or after further purification of the diblock copolymer.

One aspect of this invention is a process comprising:
a) forming in a first solvent a polymer mixture comprising a diblock copolymer, poly(Monomer1)-b-poly(Monomer2), and at least one homopolymer selected from poly(Monomer1) and poly(Monomer2);
b) adding a second solvent to the dissolved polymer mixture to form:
    micelles comprising the diblock copolymer and
    a solution comprising at least one of poly(Monomer1) and poly(Monomer2);
c) inducing micellar aggregation to form isolable particles; and
d) separating the particles from the solution that comprises at least one of poly(Monomer1) and poly(Monomer2).

In one embodiment, PMMA-b-polystyrene diblock copolymers can be separated from the corresponding PMMA and polystyrene homopolymers by first treating the crude mixture with THF, and then adding MeOH/THF and gently stirring the mixture. Aggregated particles can be isolated by centrifugation or filtration methods from the supernatant (which contains PMMA homopolymer and some PMMA-rich diblock copolymer). In some embodiments, the THF dissolution and MeOH/THF addition steps are repeated. The isolated substantially PMMA-free polymer is then treated with a theta solvent (e.g., cyclohexane) to remove the polystyrene homopolymer. SEC, IPC and UV analyses are useful techniques for characterizing the polymer fractions at the various stages of the purification. Examples of the use of IPC in polymer characterization have been disclosed by Y. Brun et al., J. Sep. Sci, 2010, 33, 3501-3510.

In one embodiment, PMMA-b-polystyrene diblock copolymers are separated from the corresponding PMMA and polystyrene homopolymers by first removing the polystyrene by extraction with a theta solvent. The PMMA homopolymer is then removed by dissolving the polystyrene-free polymer in THF and adding MeOH/THF to form micelles of the desired diblock copolymer, which will settle out or can be isolated by centrifugation as the micelles aggregate into larger particles.

In one embodiment, OPMA-b-ASM diblock copolymers are separated from the corresponding OPMA and ASM homopolymers by treating the polymer mixture with toluene and then slowly adding a mixture of toluene and cyclohexane. Aggregated particles gradually settle out, and the ASM homopolymer can be removed with the solvent phase. The remaining solid is treated with ethanol, and then a mixture of ethanol and water is added. Particles are allowed to settle, providing a liquid phase and a swollen polymer phase. The clear top phase is removed, and the ethanol/water treatment is repeated with the solid, giving a OPMA homopolymer-free diblock copolymer.

In one embodiment, 6,2-ZFM-b-ASM diblock copolymers are separated from the corresponding 6,2-ZFM and ASM homopolymers by first removing the 6,2-ZFM homopolymer by extracting it in a partially fluorinated solvent, such as HFE-7200. The remaining solid is treated with THF, and the resulting foam is then treated with a mixture of THF and ethanol to form aggregated particles of the desired diblock copolymer.

Another aspect of this invention is an article comprising a substrate and the first or second composition disposed on the substrate. Suitable substrates include semiconducting materials, insulating materials, conductive materials, or any combination thereof, including multilayered structures. Thus, a substrate can comprise a polyimide or a semiconducting material such as: Si, SiGe, SiGeC, SiC, GaAs, InAs, InP or other III/V or II/VI compound semiconductors. A substrate can comprise a silicon wafer or process wafer such as that produced in various steps of a semiconductor manufacturing process, e.g., an integrated semiconductor wafer. A substrate can comprise a layered substrate such as Si/SiGe, Si/SiC, silicon-on-insulators (SOIs) or silicon germanium-on-insulators (SGOIs). A substrate can comprise one or more layers, including: a dielectric layer; a barrier layer for copper such as SiC; a metal layer such as copper; a hafnium dioxide layer; a silicon layer; a silicon oxide layer, or combinations thereof. A substrate can comprise an insulating material such as an organic insulator, an inorganic insulator or a combination thereof, including multilayers. A substrate can comprise a conductive material, for example, polycrystalline silicon (polySi), an elemental metal, alloys of elemental metals, a metal silicide, a metal nitride, or combinations thereof, including multilayers. A substrate can comprise ion-implanted areas, such as ion-mplanted source/drain areas having p-type or n-type diffusions active to the surface of the substrate.

Suitable substrates include Si, quartz, GaAs, $Si_3N_4$, $Al_2O_3$, and polyimides. In some embodiments, the Si surface is an oxide, optionally coated with HMDS (hexamethyldisilazane). In some embodiments, the coating is a random copolymer, e.g., of Monomer1 and Monomer2. In some embodiments, the Si surface is coated with $R^1SiCl_3$, where $R^1$ is an alkyl group or a partially or fully fluorinated alkyl group. The surface can be optionally patterned with arrays of lines, dots or other features. In some embodiments, the disposed composition is solvent annealed or thermally annealed so that the diblock copolymers self-assemble into microdomains of 5 to 200 nm.

It has been found that diblock copolymers (DBCP) described herein can be used in directed self-assembly applications (DSA), in which structures can be formed at the nanoscale level. More particularly, diblock copolymers (also referred to herein as block copolymers or block polymers) can be used to form devices having holes, vias, channels, or other structures at predetermined positions.

More particularly, structures formed via directed self-assembly may be useful in constructing semiconductor devices in which the critical dimensions are smaller than those currently accessible via standard lithographic and etching techniques. DSA patterning methods can take advantage of the small critical dimensions of BCP domains while at the same time providing precise control of BCP domain placement for arbitrary patter layouts, thereby enabling higher resolution patterning. In addition, these methods are compatible with conventional optical lithography tools and imaging materials.

Under certain conditions, the blocks of the diblock copolymers described herein phase-separate into microdomains (also known as "microphase-separated domains" or "domains"), and in the process, nanoscale features of dissimilar chemical composition are formed. The ability of block copolymers to form such features makes them potentially useful in nanopatterning, and to the extent that features with smaller critical dimensions can be formed, this should enable the construction of features which would otherwise be difficult to print using conventional lithography. However, without any guidance from the substrate, the microdomains in a self-assembled block copolymer thin film are typically not spatially registered or aligned. To address the problem of spatial registration and alignment, graphoepitaxy can be used to enable directed self-assembly, in which self-assembly is guided by topographical features of lithographically pre-patterned substrates. BCP graphoepitaxy provides sub-lithographic, self-assembled features having a smaller characteristic dimension than that of the prepattern itself.

Some initial applications of DSA based on BCP graphoepitaxy have been reported. Directed self-assembly of block copolymers has been used to reduce the diameter of holes created with conventional lithographic methods (see, for example, US Published Patent Application 20080093743A1). With this technique, a solution containing a block copolymer is applied on a topographical substrate having openings therein, thereby filling the openings. Microphase-separated domains are then formed in the openings as a result of an annealing process. The discrete, segregated polymer domains formed in the centers of the openings are subsequently removed via an etch process to create holes that are smaller than the corresponding openings. Note, however, that the pitch of the pattern realized with this approach is unchanged from the pitch of the starting lithographic prepattern (i.e., there is no increase in pattern density).

Overall pattern density (related here to the smaller CD and smaller pitch) has been increased by creating an array of self-assembled polymer domains in a lithographically defined trench (see Cheng et. al., Applied Physics Letters, 2002, 81, 3657). However, there was effectively no control of the placement of each self-assembled domain, and hence no control over the final location of the corresponding holes generated as a result of the etch process. Thus, these holes do not form an array in which the domains have predetermined positions, and the standard deviation of these positions can vary from a precise array by as much as 10% of the average center-to-center domain spacing (see Cheng et. al., Advanced Materials 2006, 18, 2505).

One aspect of the present invention is a method that comprises providing a substrate having a surface comprising one or more directing structures, then applying, over the surface, a layer comprising a diblock copolymer, in which components of the copolymer are immiscible with one another. The polymer is allowed to form a plurality of discrete, segregated domains (e.g., an annealing process may be used to induce this self-assembly), in which the position of each discrete, segregated domain is predetermined by the directing structures.

In one embodiment, a polymer solution containing at least one diblock copolymer (DBCP) is prepared. Additional DBCPs, homopolymers, copolymers, surfactants and photoacid generators can also be employed. Next, the solution is cast on the substrate having a segmented prepattern, to form well-registered polymer domains within the desired area. Increasing the mobility of the diblock copolymers (e.g., through baking or solvent vapor treatment) may be required for certain polymers. For diblock copolymers for which the glass transition temperature is lower than room temperature, spontaneous self-assembly may occur. Additional annealing (including thermal annealing, thermal gradient annealing, solvent vapor annealing or some other gradient field) may be optionally employed to remove any defects. Finally, at least one self-assembled diblock copolymer domain is selectively removed to generate holes, which can then be transferred into the underlying substrate. For example, both bilayer (resist and transfer layer) and trilayer (resist, hard mask layer, transfer layer) schemes are possible (see, for example, "Introduction to Microlithography", second edition, edited by Larry F. Thompson, C. Grant Willson and Murrae J. Bowden, American Chemical Society, Washington, D.C., 1994). Prior to the pattern development and pattern transfer, the self-assembled polymer may be optionally chemically modified to improve properties necessary for pattern transfer, such as etch resistance or certain mechanical properties.

The diblock copolymer (DBCP) formulation can be applied by spin coating it onto the substrate, e.g., at a spin speed from about 1 rpm to about 10,000 rpm, with or without a post-drying process. Other processes can be used for applying the diblock copolymer formulation to the substrate, such as dip-coating and spray-coating.

As used herein, "phase-separate" refers to the propensity of the blocks of the block copolymers to form discrete microphase-separated domains, also referred to as "microdomains" and also simply as "domains." The blocks of the same monomer aggregate to form domains, and the spacing and morphology of domains depends on the interactions, volume fractions, and number of different blocks in the block copolymer. Domains of block copolymers can form spontaneously while applying them to a substrate such as during a spin-casting step, or they can form as a result of an annealing step. "Heating" or "baking" is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" is used to induce phase separation, and in addition, can be used as a process for reducing or removing defects in the layer of lateral microphase-separated domains. It generally involves heating at elevated temperature above the glass transition temperature of the block copolymers, for a period of time (e.g., several minutes to several days).

Solvents that can be used vary with the solubility requirements of the diblock copolymer components and the various additives, if any. Exemplary casting solvents for these components and additives include propylene glycol monomethyl ether acetate (PGMEA), ethoxyethyl propionate, anisole, ethyl lactate, 2-heptanone, cyclohexanone, amyl acetate, γ-butyrolactone (GBL), toluene, trifluorotoluene, Solkane, HFE-7200, THF, and mixtures thereof.

Additives can be selected from the group consisting of: additional polymers (including homopolymers, star polymers and copolymers, hyperbranched polymers, block copolymers, graft copolymers, hyperbranched copolymer, random copolymers, crosslinkable polymers, and inorganic-containing polymers), small molecules, nanoparticles, metal compounds, inorganic-containing molecules, surfactants, photoacid generators, thermal acid generators, base quenchers, hardeners, cross-linkers, chain extenders, and combinations comprising at least one of the foregoing, wherein one or more of the additives co-assemble with the block copolymer to form part of one or more of the self-assembled domains.

Selected diblock compositions can undergo crosslinking reactions using available functionality and formulation with polyfunctional reagents selected from the group consisting of epoxides, alkoxymethyl-protected glycourils, anhydrides, and isocyanates, optionally with the aid of latent catalysts.

As used herein, a "post" is a directing structure that is the result of positive fabrication in which the structure length is longer in the axis perpendicular to the substrate than in axes parallel to the substrate.

As used herein, a "wall" is a directing structure that is a result of positive fabrication in which the structure length is longest in one axis parallel to the substrate and much shorter in the other axis parallel to the substrate and the axis perpendicular to the substrate.

As used herein, a "mesa" is a directing structure that is a result of positive fabrication in which the feature lengths in the same plane as the substrate are much longer than the feature length in the axis perpendicular to the substrate.

As used herein, a "grating" is a directing structure that is an array of walls in the same plane and direction with a single pitch.

As used herein, a "mesh" is a directing structure that is an array of walls in the same plane and two perpendicular directions with a single pitch.

As used herein, a "trench" is a region between two mesas and void of directing structures and in the same plane as the directing structures.

In view of the above subject matter then, it can be seen that several inventive features are disclosed in the following Embodiments, without any limitations:

Embodiment 1

A composition comprising a block copolymer, wherein the block copolymer comprises:
a) a first block derived from the polymerization of Monomer-1,

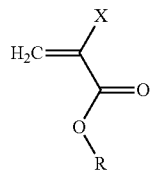

Monomer1 wherein X is H or methyl, R is selected from the group consisting of: $C_1$-$C_8$ alkyl and partially fluorinated alkyl groups, optionally substituted with hydroxyl or protected hydroxyl groups and optionally containing ether linkages; and $C_3$-$C_8$ cycloalkyl groups; and
b) a second block covalently attached to the first block, wherein the second block is derived from the polymerization of Monomer2,

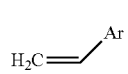

Monomer2 wherein Ar is a pyridyl group, a phenyl group, or a phenyl group comprising substituents selected from the group consisting of hydroxyl, protected hydroxyl, acetoxy, $C_1$-$C_4$ alkoxy groups, phenyl, substituted phenyl, —SiR'$_3$, and —OC(O)OR', where R' is selected from the group consisting of $C_1$-$C_8$ alkyl groups, and wherein:
Monomer1 and Monomer2 are selected such that the difference between the total surface energy values of a homopolymer of Monomer1 and a homopolymer of Monomer2 is greater than 10 dynes/cm;

the first block comprises 5-95 wt % of the block copolymer, the molecular weight of the block copolymer is between 5,000 and 250,000, and
the composition comprises less than 5 wt % of the homopolymer of Monomer1 and less than 5 wt % of the homopolymer of Monomer2.

Embodiment 2

The composition of Embodiment 1, wherein R is methyl, cyclohexyl, or a partially fluorinated alkyl group selected from the group consisting of —CH$_2$C(CF$_3$)$_2$OH, —CH$_2$CH$_2$CH$_2$CF$_2$C$_4$F$_9$, —CH$_2$CH$_2$C$_6$F$_{13}$, and —CH$_2$CF$_2$CF$_2$CF$_2$CF$_2$H.

Embodiment 3

The composition of Embodiment 1, wherein Ar is pyridyl, phenyl, acetoxyphenyl, or methoxyphenyl.

Embodiment 4

A composition comprising a block copolymer, wherein the block copolymer comprises:
a) a first block derived from the polymerization of a monomer selected from the group consisting of isobornyl (meth)acrylate, trifluoroethyl (meth)acrylate, hexafluoroisopropyl (meth)acrylate, octafluoropentyl (meth)acrylate, (CH$_2$=C(CH$_3$)CO$_2$CH$_2$C(CF$_3$)$_2$OH) and its protected analogues, (CH$_2$=C(CH$_3$)CO$_2$CH$_2$CH$_2$CH$_2$CF$_2$C$_4$F$_9$), (CH$_2$=C(CH$_3$)CO$_2$CH$_2$CH$_2$C$_6$F$_{13}$), (CH$_2$=C(CH$_3$)CO$_2$CH$_2$CH$_2$C$_4$F$_9$), (CH$_2$=C(CH$_3$)CO$_2$CH$_2$CH$_2$C$_3$F$_7$), CH$_2$=C(CH$_3$)CO$_2$C$_2$H$_4$C$_2$F$_5$, CH$_2$=C(CH$_3$)CO$_2$C(CH$_3$)$_2$CH$_2$CH$_2$C$_6$F$_{13}$, and (CH$_2$=C(CH$_3$)CO$_2$CH$_2$C$_3$F$_7$); and
b) a second block covalently attached to the first block, wherein the second block is derived from the polymerization of Monomer2,

Monomer2 wherein Ar is a pyridyl group, a phenyl group, or a phenyl group comprising substituents selected from the group consisting of hydroxyl, protected hydroxyl, acetoxy, $C_1$-$C_4$ alkoxy groups, phenyl, substituted phenyl, —SiR'$_3$, and —OC(O)OR', where R' is selected from the group consisting of $C_1$-$C_8$ alkyl groups.

Embodiment 5

An article comprising a substrate and the composition of Embodiment 1 disposed on the substrate.

Embodiment 6

The article of Embodiment 5, wherein the substrate is patterned with features selected from the group consisting of curved lines, straight lines line segments, and dots.

Embodiment 7

A process comprising:
a) treating in a first solvent a polymer mixture comprising a diblock copolymer, poly(Monomer1)-b-poly(Monomer2), and at least one homopolymer selected from poly(Monomer1) and poly(Monomer2);

b) adding a second solvent to the polymer mixture to form:
   micelles comprising the diblock copolymer and
   a solution comprising at least one of poly(Monomer1) and poly(Monomer2);
c) allowing the micelles to aggregate to form larger particles; and
d) separating the particles from the solution that comprises at least one of poly(Monomer1) and poly(Monomer2).

EXAMPLES

General

ASM=acetoxy styrene monomer
MMA=methylmethacrylate
PMMA=poly(methylmethacrylate)
PMMA-ttc=PMMA with trithiocarbonate end group
OPMA=$CH_2$=$C(CH_3)CO_2CH_2CF_2CF_2CF_2CF_2H$
6,2-ZFM=$CH_2$=$C(CH_3)CO_2CH_2CH_2C_6F_{13}$
MEK=methyl ethyl ketone
THF=tetrahydrofuran
PFA=tetrafluoroethylene-perfluorovinyl ether copolymer
V-601=dimethyl 2,2'-azobis(2-methylpropionate), available from Wako Specialty Chemicals, Richmond, Va.
HFE-7200=$CH_3CH_2OC_4F_9$, available from 3M, St. Paul, Minn.
Solkane =$CH_3CF_2CH_2CF_3$
SEC=size-exclusion chromatography
IPC=interaction polymer chromatography All reagents were obtained from commercial suppliers and used as received, unless otherwise indicated.

Example 1

A 3-neck flask fitted with 1 addition funnel, condenser, and nitrogen gas inlet, and a depth-adjustable thermocouple was charged with 2-heptanone (15.0 g) and PMMA-ttc (10.0 g, Mw=34100, PD=1.18 by SEC, calculated as 0.22 mmol RAFT ends). Polymer solution of the PMMA-ttc in 2-heptanone was prepared at ca. 75 t. A funnel was charged with styrene (20 g, run through a column of neutral alumina) and mixed with 2-heptanone (6 g). Stirring was provided by a device equipped with a stainless steel shaft and a small Teflon® fluoropolymer paddle. A 5 mL portion of styrene feed was added to the flask, which was purged with nitrogen for 20 min. The temperature was increased to 115° C., and the remaining monomer was fed over 1 h. After 21 h at 122-125° C., the conversion was 55%. After an additional 34 h at 125-130° C., the conversion was determined to be 86% by $^1$H NMR ($CDCl_3$). MEK (70 mL) was added to the reaction mixture to obtain a polymer solution. This was added to 3 L of methanol to precipitate the product, which was isolated by filtration. Air-drying followed by pumping afforded 22.7 g of a solid.

Mw=68901; Mn=45967; MP=83833; PD=1.499.
UV (THF, 1 g/liter): $A_{261}$=1.279, $A_{311}$=0.176.

Initial attempts to isolate purified diblock copolymer by treatment of the solid with toluene, followed by addition of isopropanol and cooling were unsuccessful. Treatment of the solid with THF, followed by addition of 1/1 THF/n-propanol, then n-propanol and cooling was also unsuccessful.

However, complete removal from the solid of the unwanted PMMA homopolymer was accomplished by the following method: the solid (22 g) was treated with THF (200 mL), and then using gentle stirring, 800 mL of 2/1 MeOH/THF was added slowly. As the added volume of solvent reached ca. 800 mL, aggregated micelles began to settle. After ca. 10 min, the top phase was removed with a dip tube. Solid was treated with THF (100 mL), then treated as above with 500 mL of 2/1 MeOH/THF. Solid particles settled and the liquid phase was removed with a dip tube. Methanol was added to the remaining solid, and after stirring, product was collected by filtration and air-dried to give a solid (18.22 g).

IPC showed complete removal of PMMA peak. A portion of the distribution containing shorter styrene block lengths was also removed.

Mw=72853; Mn=55637; Mz=85639; MP=83787; PD=1.309.

Overall composition: MMA=34.4%; S=65.6%

A portion of the PMMA homopolymer-free solid (17.6 g) was treated 3 times consecutively with 400 mL cyclohexane using 0.5 hr periods of gentle stirring under $N_2$ at 40° C. Solids were allowed to settle, and the supernatant was removed using a narrow-bore (ca. 3/16") PFA dip-tube. Supernatants (G1-G3) were individually evaporated and pumped so that the polymer fraction removed could be characterized.

TABLE 1

| Characterization of Supernatant Portions | | | | | |
|---|---|---|---|---|---|
| Sample (wt) | Mw | Mn | Mz | MP | PD |
| G1 (1.78 g) | 40857 | 28540 | 52802 | 53104 | 1.432 |
| G2 (1.02 g) | 42659 | 29651 | 55459 | 54173 | 1.439 |
| G3 (0.44 g) | 44018 | 29817 | 58483 | 54852 | 1.476 |

The SEC traces for G1, G2, and G3 were very similar and correspond to polystyrene homopolymer.

Overall composition ($^1$H NMR) of the final product indicated that polystyrene homopolymer was preferentially removed in this step. IPC confirmed that the final isolated product was substantially free of styrene homopolymer.

Product, wt=14.86 g.
$^1$H NMR ($CDCl_3$): MMA=41.0%; S=59.0%.
UV (THF, 1 g/liter): $A_{261}$=1.127, $A_{269}$=0.799, $A_{311}$=0.086

Example 2

A 3-neck flask fitted with an addition funnel, a condenser, a nitrogen gas inlet, and a thermocouple was charged with 2-heptanone (15.0 g) and PMMA-ttc (10.0 g, Mw=34,100, PD=1.18, calculated as 0.22 mmol RAFT ends). The PMMA-ttc polymer solution was prepared at ca. 75° C. and stirred using an overhead device equipped with a stainless steel shaft and a small Teflon® fluoropolymer paddle. Styrene (30.0 g, 0.144 mol) was freed of inhibitor and added directly to the reactor. The reactor was purged with nitrogen for 20 min. The temperature was increased to 115° C., and maintained at about 114° C. for 22 h; styrene conversion was 78.6%.

IPC analysis indicated that the sample contained styrene homopolymer, the desired diblock copolymer, and a trace of PMMA.

Removal of Polystyrene Homopolymer.

Isolation of the desired diblock copolymer was carried out with several differences vs. Example 1. For example, residual PMMA and MMA-rich tail were removed last. THF (55 mL) was added to the vessel, and the mixture was then heated to ca. 75° C. to speed production of a homogeneous polymer solution. The cooled solution was added dropwise to 1 L of methanol to precipitate the product, which was isolated by filtration. Air-drying afforded 30.6 g of solid. Solid was transferred to a 1 L, 3-neck flask fitted with a $N_2$ adapter. Cyclohexane (500 mL) was added, and the slurry was stirred with a magnetic stir-bar. The vessel was maintained in an oil bath at 45° C. (internal temp=ca. 40° C.). Solid was washed 4 times with cyclohexane, wherein liquid phases were removed with a vacuum-operated dip tube. Individual supernatant fractions were stripped and pumped to monitor the fractionation. IPC analyses show essentially complete removal of polystyrene homopolymer by protocol.

Removal of PMMA.

The solid isolated from the above cyclohexane treatment (23.9 g) was treated with 200 mL THF in a 2 L round-bottomed flask fitted with $N_2$ adapter. Using gentle stirring, 800 mL of 2/1 MeOH/THF was added slowly. As added volume of solvent reached ca. 200 mL, the appearance of the mixture changed significantly. At ca. 500 mL added, additional particle aggregation had started. Further growth and settling was slow, so additional methanol was added in 20 mL portions (4). Stirring was continued for 0.5 hr, and then the mixture was cooled in an ice bath. When the internal temperature had reached ca. 10° C., the particles settled nicely. The top phase (supernatant 1) was removed with a dip tube. (Solids were left in the vessel with liquid entrained.) Solid was treated with THF (100 mL), then with 500 mL of 2/1 MeOH/THF. Solid particles settled easily, and the liquid phase was removed with a dip tube (supernatant 2). Methanol was added to the remaining solid, and after stirring, product was collected by filtration and air-dried. There was obtained: 20.1 g. Combined supernatants were stripped and pumped to give 2.74 g of solid.

NMR ($CDCl_3$) of the bulk sample showed S=181.7/H, MMA=100.0/H; thus, S=64.5%, MMA=35.5%.

IPC Analysis:

Complete removal of MMA homopolymer and MMA-rich portion of the distribution were achieved.

Comparative Example A

A 3-neck flask fitted with 1 addition funnel, condenser, nitrogen gas inlet, and a depth-adjustable thermocouple was charged with 2-heptanone (37.5 g) and PMMA-ttc (25.0 g, Mw=34,100, PD=1.18, calculated as 0.55 mmol RAFT ends). Styrene (75.0 g, 0.36 mol) was freed of inhibitor and added directly to the reactor. Polymer solution was prepared at ca. 75° C. and stirred using an overhead device equipped with a stainless steel shaft and a small Teflon® fluoropolymer paddle. The reactor was purged with nitrogen for 20 min. The temperature was increased to 115° C., and maintained at 114.9-116.5° C. for 22 h.

$^1$H NMR ($CDCl_3$) showed conversion was 77.8%.

IPC (small sample was pumped to give solid) indicated that the sample contained styrene homopolymer, the desired diblock copolymer, and a trace of PMMA homopolymer, similar to that of Example 2.

Attempted Isolation Procedure without Sufficient Liquid Phase Composition Control The reaction mixture was treated with THF (250 mL) and the solution was transferred to a 5 L, 3-neck flask. Methanol (3 L) was added slowly with overhead stirring. A fine powder was produced and this settled easily. Liquid was removed with a dip tube. Another liter of methanol was added to wash the solid. After the solid settled, liquid was removed with a dip tube. A fritted dip tube was used to remove as much liquid as possible. Solid was still wet with residual liquid. Cyclohexane (600 mL) was added and the mixture was stirred while the contents were heated using a 40-45° C. water bath. Removal of the initial liquid phase proceeded satisfactorily, but there did not seem to be much dissolved polymer. The removed liquid eventually phase separated, and the composition of the liquid phases in this operation was not known. More cyclohexane (600 mL) was added, and heating at 40-45° C. was continued for 0.5 h. After ca. 1.5-2 h, there was no sign of useful phase separation. The entire mixture was subjected to rotary evaporator removal of volatiles. After pumping, the product was removed, and additional volatiles were removed with an aspirated filter funnel. There was obtained a crude product, 86 g. IPC analysis showed no fractionation of MMA-b-styrene and polystyrene.

Example 3

Removal of Polystyrene Homopolymer

The crude material obtained in Comparative Example A was subjected to a cyclohexane wash process, as follows: The solid was transferred to a 1 L, 1-neck flask, and treated with cyclohexane (500 mL). This was heated at 45° C. for 0.5 h, followed by removal of the top layer (cloudy). Another 250 mL cyclohexane was added, the mixture heated at 40° C., and then allowed to settle. The top phase was removed, and the process repeated with another 250 mL portion of cyclohexane. Combined top phases were stripped to give 9 g of residue, which was discarded.

Another 250 mL cyclohexane was added to the solid. The mixture was stirred for 0.5 h at 37° C., then allowed to settle overnight while the temperature was maintained at ca. 37-38° C. (18 h). The top layer was removed with a PFA dip-tube; evaporation gave 8 g solid residue. NMR showed almost no loss of MMA segment. Another 600 mL cyclohexane was added to the solid. The mixture was stirred for 0.5 h at 37° C., then allowed to settle overnight while the temperature was maintained at ca. 37-38° C. (18 h). The top layer was removed with a PFA dip-tube; evaporation gave 2.3 g solid residue, which was discarded. The block polymer was quite swollen with cyclohexane.

Finally, another 500 mL cyclohexane was added to the solid. The mixture was stirred for 0.5 hr at 37° C., then allowed to settle overnight while the temperature was maintained at ca. 37-38° C. (18 h). The top layer (including some small particles) was removed with a PFA dip-tube. Evaporation gave 1.2 g solid residue. IPC showed nearly complete removal of polystyrene homopolymer; the remaining PMMA and MMA-rich portions of the distribution are still present.

The remaining polymer was dried a filter funnel to give. 64.2 g of solid.

Removal of MMA-Rich Components.

A 5 L, 3-neck vessel equipped with overhead stirrer and $N_2$ inlet was charged with 500 mL THF and the 64 g of polymer from above. A 2/1 (v/v) mixture of methanol/THF was added from a calibrated dropping funnel. The process was interrupted several times to estimate scattered light intensity as indicated in Table 1, below:

| Incremental Volume Added | Total Solvent Composition | Laser Scattering Intensity |
|---|---|---|
| 450 mL | 31.6/68.4 | Minor |
| 250 mL | 38.9/61.1 | More intense |
| 200 mL | 42.8/57.2 | More intense |
| 250 mL | 46.4/53.6 | Major increase |
| 200 mL | 48.6/51.4 | Cloudy |
| 250 mL | 50.7/49.3 | More cloudy |
| 200 mL | 52.1/47.9 | Cloudy/milky |
| 150 mL (MeOH only) | 55.0/45.0 | Poor settle rate |
| 200 mL (MeOH only) | 58.4/41.6 | Settling now OK; top phase still cloudy |

After the last addition of methanol, the mixture was cooled to 10° C., allowed to settle for 0.5 h, and then the top phase was removed with a dip tube. The polymer was treated in THF (300 mL) and slowly treated with 1250 mL THF/MeOH (350 mL/900 mL). The top phase was removed and 1500 mL MeOH was added and mixture stirred for 0.5 hr. The solid was filtered, air-dried with $N_2$, then pumped overnight. Obtained 47.5 g of powder. The THF/MeOH removed liquid from above were stripped and pumped to give 6 g of residual solid. The molecular weight distribution of this residual solid was bimodal, with peak centers at 50,000 and 98,000. IPC analyses demonstrate that the polymer compositions in the removed, residual solid are substantially different from the major diblock fraction.

NMR ($CDCl_3$) of the bulk sample showed styrene=181.2/H, MMA=100.0/H; thus, styrene=64.4%, MMA=35.6%.

Example 4

A 3-neck flask fitted with a condenser, a nitrogen gas inlet, and a depth-adjustable thermocouple was charged with 2-heptanone (33.0 g), OPMA-ttc (35.0 g, Mw=27,900, PD=1.17 vs. PMMA) and ASM (42.0 g). Stirring was provided by an overhead device using a stainless steel shaft equipped with a small Teflon® fluoropolymer paddle. A nitrogen purge was applied for 20 min. The flask was placed in an oil bath, and temperature was maintained at 115-125° C. for 23 h; $^1H$ NMR ($CDCl_3$) showed that ASM conversion was 64%.

The reaction mass was diluted with THF (75 mL) and the product was precipitated by addition of heptane (1500 mL). Solvent was removed with a dip tube. Solid was treated with THF (120 mL) and reprecipitated by addition of heptane (1500 mL). Filtration and drying provided 60.4 g of light yellow solid.

SEC (THF; vs. PMMA): Mw-45720; Mn=36710; Mz=52220; MP=53700; PD=1.245.

IPC showed a mixture of OPMA homopolymer, ASM homopolymer, and diblock. The diblock band shape was symmetrical; peaks associated with homopolymers were small.

Separation by Micelle Aggregation.

Product (60 g) was added to toluene (250 mL) in a 2 L, 4-neck flask. A suspension of particles was obtained and some light-scattering was observed. The suspension was heated to 80° C., then cooled to room temperature. A mixture of toluene (18 g) and cyclohexane (27 g) was added over 10 min. The initial particles were transformed to larger aggregates during this addition, and the quantity of foam diminished substantially. With continued stirring (15 min), the polymer particles gradually phase-separated and settled to the bottom of the flask. Almost no light-scattering particles remained in the supernatant. The upper liquid was decanted. The supernatant liquid was stripped and pumped to provide 3.85 g of a residue, which was mostly ASM homopolymer. The remaining polymer-rich phase was treated with toluene (250 mL). Polymer particles were again agglomerated by addition of the toluene/cyclohexane solvent mixture. Stripping and pumping the supernatant liquid provided 2.14 g of a residue. Repeating the steps of suspension, aggregation, and stripping the resultant supernatant provided 0.75 g of residue. NMR analyses showed an OPMA/ASM ratio of 11.4/88.6.

The bulk of the product was stirred with cyclohexane (500 mL) to produce a filterable solid. The solid was collected and air-dried to provide 51.6 g of solid (OPMA/ASM=46.5/53.5).

IPC showed essentially complete removal of ASM homopolymer and a diminished "higher ASM content" portion of the diblock component.

Removal of OPMA Homoolymer.

Ethanol (500 mL) was added to the dried, cyclohexane-treated product above. The mixture was stirred at 45° C. for 0.75 h, cooled to room temperature, and then held at 0° C. for 0.5 h. Then a mixture of ethanol (94 mL) and water (6 g) was added. Particles were allowed to settle overnight, providing a liquid phase and a swollen polymer phase. The clear top phase was removed with a dip tube, and the remaining material was processed by centrifuge. The supernatant portions were combined, stripped, and pumped to give 4.6 g of residue (OPMA/ASM=85/15).

The ethanol/water treatment was repeated using the centrifuged solid to give 35.5 g of a solid with the following characteristics:

$^1H$ NMR ($CDCl_3$): OPMA/ASM=43.5/56.5

UV (THF, 1.00 g/L, 1 cm): $A_{312}$=0.201

SEC (THF, vs PMMA): Mw=50733; Mn=46148; Mz=54522; MP=54410; PD=1.099.

SEC (by universal calibration methods): Mw=92362; Mn=80290; MP=89704, PD=1.15.

IPC: single component consistent with OPMA-b-ASM diblock.

The OPMA-b-ASM polymers were shown to be capable of self-assembly. The OPMA-b-ASM polymers (with molecular weights shown in the examples) have a natural feature pitch ($L_o$) ranging from 31 to 44 nm, thus providing for a feature size of 15 nm. The fluoro-methacrylate block was removed photolytically with solvent development, leaving the remaining acetoxystyrene. It was shown that HSQ posts directed the OPMA-b-ASM rectangle pattern very well along the x-axis, but lacked direction along the y-axis. It was also shown that square arrays of posts effectively direct the OPMA-b-ASM in a "chaotic orthogonal" manner.

Example 5

Synthesis of 6,2-ZFM-ttc

A 3-neck flask fitted with an addition funnel, a condenser, a nitrogen gas inlet, a thermocouple, and an overhead stirrer assembly was charged with trithiocarbonate RAFT agent ($C_{12}H_{25}SC(S)SC(CH_3)(CN)CH_2CH_2CO_2CH_3$, 0.992 g, 2.37 mmol) and HFE-7200/THF (1/1 v/v, 67 mL). An initiator, V-601 (FW=230.26, 55 mg, 0.239 mmol) in HFE-7200/THF (1/1 v/v, 29 mL), was charged to the addition funnel. The reaction flask was charged with 6,2-ZFM (50 g). The reaction flask was purged with nitrogen for 20 min. The temperature in the reaction flask was increased to 70° C. The initiate or solution was fed over 4 h, and heating was continued for additional 18 h.

The product was precipitated by slow addition to methanol (1 L). Product was filtered, washed with methanol, and air-dried to give a yellow solid (6,2-ZFM-ttc, 29.6 g).

$^1H$ NMR (THF) featured 4.25 (bd, $OCH_2$, 100/H) and 3.23 (bd, a=4.07, or 2.04/H, $SCH_2$).

SEC (determined in HFIP system, triple detection): Mw=22010; Mn=19230.

Synthesis of Diblock Copolymer

A 3-neck flask fitted with condenser, nitrogen gas inlet, and thermocouple was charged with 6,2-ZFM-ttc (25.0 g) and ASM (37.5 g), followed by the addition of trifluorotoluene (85 g). The mixture was purged with nitrogen for 20 min, then heated to an internal temperature of 106-112° C. for 63 h.

$^1$H NMR (THF-d8) showed ASM conversion was 59%.

The reaction mass was diluted with trifluorotoluene (30 mL), and filtered to remove a small amount of insoluble material. The polymer solution was transferred to an addition funnel, and then added slowly to methanol (1 L) with good overhead stirring. After stirring for 0.5 h, the product was collected by filtration and dried to give 45.0 g of light yellow solid.

IPC showed: 1 main peak with retention time=19.75 min; minor peaks at 14.2 (6,2-ZFM homopolymer), and 21.4 min (ASM homopolymer).

$^1$H NMR analysis of above bulk solid (THF-d8): 6,2-ZFM/ASM=28.6/71.4 (mol %). This corresponds to 52/48 wt %.

Purification of Diblock Copolymer

Sample (44 g) was washed with HFE-7200 (330 mL, 2 repetitions). The polymer/solvent combination was heated/stirred at ca. 50° C. The resulting particles became quite small during this process. Filtration was accomplished using a fine frit. Product was dried after the $2^{nd}$ wash step to give 38.5 g of material.

IPC analysis showed essentially complete removal of the 6,2-ZFM homopolymer.

The above dried sample was treated with THF (112.5 g, 25% solids). With stirring and mild warming (ca. 35° C.), most of the mixture was converted to foam with small bubble diameters. The stirred mixture was treated slowly with a mixture of ethanol (192.5 g) and THF (80 g). At the end of this addition, the polymer appeared at the bottom as aggregated particles. The liquid phase still contained suspended polymer particles, and a layer of foam remained at the top. More ethanol (5 g) was added to the stirred mixture. Particles were collected after centrifuging; the liquid phase was easily decanted. Polymer was dried under vacuum to give 33.4 g of material.

$^1$H NMR (THF-d8): integration showed 6,2-ZFM=100/H, ASM=218.9/H, or a 31.4/68.6 molar ratio.

SEC (HFIP, triple detection): Mw=37500, Mn=36070.

Small angle x-ray scattering (SAXS) analysis of a powder sample clearly showed a lamellar structure, wherein the period of the lamellar repeat is 22.1 nm.

Example 5A

Synthesis of 6.2-ZFM-ttc

A 4-neck flask fitted with condenser and nitrogen gas inlet with an adaptor accommodating a septum for initiator solution feed via syringe pump, a thermocouple, and an overhead stirrer assembly was charged with trithiocarbonate RAFT agent $C_{12}H_{25}SC(S)SC(CH_3)(CN)CH_2CH_2CO_2CH_3$ (4.96 g, 11.89 mmol) and 1/1/v/v HFE-7200/THF (225 mL). V-601 (FW=230.26, 600 mg) in 20 mL HFE-7200/THF (7.5 mL/12.5 mL) was charged to the syringe pump. The reaction flask was charged with 6,2-ZFM (125 g) and purged with nitrogen for 20 min. The internal temperature was increased to 68° C. A small portion (2.15 mL) of initiator solution was fed over 5.45 min. Initiator feed was continued for 29.5 hr, and heating was continued for an additional 4 hr.

The reaction mixture was added slowly to methanol (1500 mL). Precipitated product was washed with methanol and air-dried overnight on a filtration funnel to provide a yellow solid (121.7 g).

$^1$H NMR (THF) featured 4.25 (bd pk, OCH$_2$, 100/H) and 3.25 (bd, a=7.22, or 3.61/H, SCH$_2$).

SEC (determined in HFIP, triple detection): Mw=14,450, Mn=13,360.

Synthesis of Diblock Copolymer

A 4-neck flask fitted with condenser and nitrogen gas inlet, thermocouple, and an overhead stirrer assembly was charged with 62.5 g of 6,2-ZFM-ttc (Mw=14,450) and 93.75 g of ASM. Trifluorotoluene (181 g) was added. A nitrogen purge sequence was followed for 20 min. The reaction mixture was heated at 91° C. for 3 hr, then at 110-112° C. for 54 hr. NMR spectroscopy was used to monitor monomer conversion, estimated as 57.1%.

The reaction mass was diluted with trifluorotoluene (50 mL) and filtered. The polymer solution was treated with 1500 mL methanol with good overhead stirring. The liquid phase was removed with a dip tube. Another 1500 mL portion of methanol was added, and the yellow powder was collected by filtration and dried to give 113.0 g of yellow solid.

IPC showed: One peak with retention time=19.45 min; early-eluting peaks corresponding to 6,2-ZFM homopolymer and ASM homopolymer were detectable, but of low intensity.

Crude product was purified by treatment with HFE-7100 (850 mL) and then heated/stirred for 0.5 hr at 50° C. The mixture was cooled to room temperature. Filtration and drying provided 98.7 g of solid. Most of the weight loss was due to uncaptured fine particles.

Micellar Aggregation to Remove ASM-Homopolymer

A portion of the above processed material (ca. 80 g) was treated with THF (240 mL), and this mixture was filtered through a 1 micron membrane. The resulting clear liquid was stirred and treated with 707 mL of a mixture of THF/ethanol (24.9/75.1, v/v). The polymer-rich phase was then washed 2× with THF/ethanol (44/56, v/v). Evaporation under reduced pressure provided 66.7 g of yellow solid.

$^1$H NMR (CDCl$_3$): ASM=234.3/H, 6,2-ZFM=100.0/H, and 6,2-ZFM/ASM=29.9/70.1.

SEC (determined in HFIP, triple detection): Mw=29,730; Mn=29,320.

Small angle x-ray scattering (SAXS) analysis of a powder sample clearly showed a lamellar structure, wherein the period of the lamellar repeat is 18.8 nm.

Example 5B

Synthesis of 6,2-ZFM-ttc

A 4-neck flask fitted with condenser and nitrogen gas inlet with an adaptor accommodating a septum for initiator solution feed via syringe pump, a thermocouple, and an overhead stirrer assembly was charged with trithiocarbonate RAFT agent $C_{12}H_{25}SC(S)SC(CH_3)(CN)CH_2CH_2CO_2CH_3$ (9.92 g=23.78 mmol) and trifluorotoluene (200 mL). V-601 (FW=230.26, 600 mg) in 20 mL trifluorotoluene was charged to the syringe pump. The reaction flask was charged with 6,2-ZFM (125 g) and purged with nitrogen for 20 min. The internal temperature was held constant at 73.5° C. A small portion (2.15 mL) of initiator solution was fed over 5.45 min. Initiator feed was continued for 31 hr. Monomer conversion was estimated as 95.2%.

The reaction mixture was added slowly to methanol (2 L). A polymer phase separated, and the liquid phase was removed with a dip-tube. The polymer was washed several times with methanol, then cooled to ca. 5° C. to produce a powder. The solid was collected by filtration and dried on the funnel overnight to afford yellow solid (119.0 g).

$^1$H NMR (CDCl$_3$) featured 4.4-4.1 (bd, OCH$_2$, 100/H), 3.67 and 3.66 (singlets, combined a=15.29, or 5.097/H), and 3.23-3.18 (bd, a=9.00, or 4.50/H, SCH$_2$).

SEC (HFIP, triple detection): Mw=11580, Mn=10,650.

Synthesis of Diblock Polymer

A 4-neck flask fitted with a condenser, and nitrogen gas inlet, and thermocouple and an overhead stirrer assembly was charged with 62.5 g of 6,2-ZFM-ttc. Trifluorotoluene (143 g) was added. Then 93.75 g of ASM was added. A nitrogen purge sequence was followed for 20 min. The reaction mixture was heated to 91° C. for 3 hr, then 110-112° C. for 54 hr, at which time NMR analysis indicated 58% monomer conversion.

The reaction mixture was diluted with trifluorotoluene (50 mL) and filtered. The polymer solution was added to 2000 mL methanol in a 3 L flask using good overhead stirring. The liquid phase was removed with a dip tube. The product was washed with methanol, dissolved in THF (200 mL), and phase separated by addition of methanol. Product was washed with additional methanol, then filtered and dried to give 92.9 g of light yellow solid.

Removal of 6,2-ZFM Homopolymer

A 20.0 g sample of the above washed solid was treated with 200 mL HFE-7200. The resulting stirred slurry was treated slowly with methanol (100 mL) and stirred for an additional 0.5 hr. The resulting polymer particles were filtered and dried to provide 19.5 g of yellow solid.

$^1$H NMR (CDCl$_3$) showed 6,2-ZFM/ASM=30.1/69.9. Degree of polymerization for the two blocks was estimated by $^1$H NMR as 20 and 47.

SEC (HFIP, triple detection): Mw=18150, Mn=17950.

Small angle x-ray scattering (SAXS) analysis of a powder sample to clearly showed a lamellar structure, wherein the period of the lamellar repeat is 9.8 nm.

Example 6

Directed Self-Assembly

Prime p-type Si (111) was submerged in CD26 TMAH-based developer (Shipley Chemicals) for 10 min at room temperature, rinsed with deionized water for 2 min, and dried under nitrogen flow. Hydrogen silsesquioxane (HSQ, 2%) in methyl isobutyl ketone was spin-cast on the Si at 4000 rpm for 60 sec at room temperature with no post-bake. The directing structure was formed by pattern-wise exposure of the HSQ to electron beam lithography in a Raith 150 system at 30 keV accelerating voltage and varying dose (6-200 fC/dot or 100-2000 uC/dot). E-beam irradiated samples were developed in a 1% NaOH/4% NaCl solution for 4 min at room temperature, rinsed with deionized water for 2 min, and dried under nitrogen flow. The samples were submerged in CD26 TMAH-based developer for 10 min at room temperature, rinsed with deionized water for 2 min, and dried under nitrogen flow. A 1 or 2% solution of the diblock copolymer in 2-heptanone was spin-cast on the samples for 60 sec at room temperature at 1000-8000 rpm, and then post-baked for 1 min at 120'. Polymer-coated samples were thermally annealed in a nitrogen-filled oven for about 2 h at 160-225° C. The methacrylate-block was removed through 220-nm light UV light exposure for 15 min, development in 1:1 isopropyl alcohol:methyl isobutylketone for 1 min at room temperature, rinsed with isopropyl alcohol for 30 sec, and dried under nitrogen flow.

What is claimed is:

1. A process for purifying a crude diblock copolymer composition comprising:
   a) forming in a first solvent a polymer mixture comprising a diblock copolymer, poly(Monomer 1)-b-poly(Monomer 2), and at least one homopolymer selected from poly(Monomer 1) and poly(Monomer 2);
   b) adding a second solvent to the polymer mixture to form: micelles comprising the diblock copolymer and a solution comprising at least one of poly(Monomer 1) and poly(Monomer 2);
   c) inducing micellar aggregation to form isolable particles; and
   d) separating the particles from the solution that comprises at least one of poly(Monomer 1) and poly(Monomer 2), whereby said isolable particles contain the purified diblock copolymer;

wherein said diblock copolymer composition comprises:
   i) a first block derived from the polymerization of Monomer 1,

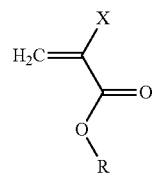

wherein X is H or methyl, R is selected from the group consisting of: C$_1$-C$_8$ alkyl and partially fluorinated alkyl groups, optionally substituted with hydroxyl or protected hydroxyl groups; and C$_3$-C$_8$ cycloalkyl groups; and
   ii) a second block covalently attached to the first block, wherein the second block is derived from the polymerization of Monomer 2,

wherein Ar is a pyridyl group, a phenyl group, or a phenyl group comprising substituents selected from the group consisting of: hydroxyl, protected hydroxyl, acetoxy, C$_1$-C$_4$ alkoxy groups, phenyl, substituted phenyl, —SiR'$_3$, and —OC(O)OR', where R' is selected from the group consisting of C$_1$-C$_8$ alkyl groups.

2. The process as set forth in claim 1 wherein Monomers 1 and 2 are selected such that the difference between the surface energy values of a homopolymer of Monomer 1 and a homopolymer of Monomer 2 is greater than 10 dynes/cm.

3. The process as set forth in claim 1 wherein the first block comprises 5-95 wt % of the diblock copolymer.

4. The process as set forth in claim 1 wherein the molecular weight of the purified diblock copolymer is between 10,000 and 250,000.

5. The process as set forth in claim 1 wherein the purified diblock polymer comprises less than 5 wt % of the homopolymer of Monomer 1 and less than 5 wt % of the homopolymer of Monomer 2.

6. The process as set forth in claim 5 wherein Monomer 1 is methyl methacrylate and Monomer 2 is styrene.

7. The product produced by the process of claim 6.

* * * * *